(12) United States Patent
Yang

(10) Patent No.: US 10,268,540 B2
(45) Date of Patent: Apr. 23, 2019

(54) DATA STORAGE DEVICE AND OPERATING METHOD THEREOF

(71) Applicant: SK hynix Inc., Gyeonggi-do (KR)

(72) Inventor: Ji Seon Yang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 108 days.

(21) Appl. No.: 15/219,448

(22) Filed: Jul. 26, 2016

(65) Prior Publication Data

US 2017/0249209 A1    Aug. 31, 2017

(30) Foreign Application Priority Data

Feb. 26, 2016 (KR) ........................ 10-2016-0023636

(51) Int. Cl.
| | | |
|---|---|---|
| *G11C 29/00* | (2006.01) | |
| *G06F 11/10* | (2006.01) | |
| *G06F 3/06* | (2006.01) | |
| *G11C 29/52* | (2006.01) | |

(52) U.S. Cl.
CPC .......... *G06F 11/1068* (2013.01); *G06F 3/064* (2013.01); *G06F 3/0619* (2013.01); *G06F 3/0679* (2013.01); *G11C 29/52* (2013.01)

(58) Field of Classification Search
CPC .. G06F 11/1068; G06F 3/0619; G06F 3/0679; G06F 3/064; G11C 29/52
See application file for complete search history.

(56) References Cited

U.S. PATENT DOCUMENTS

| | | | | |
|---|---|---|---|---|
| 2009/0125790 | A1* | 5/2009 | Iyer ..................... | G06F 11/1068 714/773 |
| 2015/0019933 | A1* | 1/2015 | Yamazaki ............. | G06F 11/108 714/758 |
| 2015/0074487 | A1* | 3/2015 | Patapoutian ........ | G06F 11/1012 714/758 |
| 2015/0154066 | A1  | 6/2015 | Grimsrud et al. | |
| 2015/0286528 | A1* | 10/2015 | Cai ..................... | G06F 11/1004 714/763 |

* cited by examiner

*Primary Examiner* — Thien Nguyen
(74) *Attorney, Agent, or Firm* — IP & T Group LLP

(57) ABSTRACT

A data storage device includes at least one nonvolatile memory device; and a controller suitable for: generating parity data for data; performing a write operation for storing the data in at least one first memory region corresponding to at least one word line of the nonvolatile memory device; and selectively storing the parity data in at least one second memory region corresponding to the word line according to a size of the data, wherein the controller generates a plurality of parity data for the data according to respective types of the first memory region where the data are to be stored, and performs the write operation by storing parity data corresponding to respective types of the second memory region among the plurality of parity data, in the second memory region.

6 Claims, 12 Drawing Sheets

DATA STORAGE DEVICE AND OPERATING METHOD THEREOF

CROSS-REFERENCES TO RELATED APPLICATION

The present application claims priority under 35 U.S.C. § 119(a) to Korean application number 10-2016-0023636, filed on Feb. 26, 2016, in the Korean Intellectual Property Office, which is incorporated herein by reference in its entirety.

BACKGROUND

1. Technical Field

Various embodiments generally relate to a data storage device and, more particularly, to a data storage device including a nonvolatile memory device.

2. Related Art

Data storage devices store data provided by an external device in response to a write request. Data storage devices may also provide stored data to an external device in response to a read request. Examples of external devices that use data storage devices include computers, digital cameras, cellular phones and the like. Data storage devices can be embedded in external devices or fabricated separately and then connected afterwards.

SUMMARY

In an embodiment, a data storage device may include: at least one nonvolatile memory device; and a controller suitable for: generating parity data for data; performing a write operation for storing the data in at least one first memory region corresponding to at least one word line of the nonvolatile memory device; and selectively storing the parity data in at least one second memory region corresponding to the word line according to a size of the data, wherein the controller generates a plurality of parity data for the data according to respective types of the first memory region where the data are to be stored, and performs the write operation by storing parity data corresponding to respective types of the second memory region among the plurality of parity data, in the second memory region In an embodiment, a method for operating a data storage device may include: receiving data; and performing a write operation for storing the data in at least one first memory region corresponding to at least one word line of at least one nonvolatile memory device and selectively store parity data generated for the data, in at least one second memory region corresponding to the word line, according to a size of the data.

In an embodiment, a method for operating a data storage device may include: generating parity data for data stored in a data buffer; and performing selectively a first write operation or a second write operation, wherein the first write operation is performed for storing data selected among the data, in at least one nonvolatile memory device, and wherein the second write operation is performed for storing the data and parity data selected among the parity data according to a size of the data, in the nonvolatile memory device.

DETAILED DESCRIPTION

Figure 1:
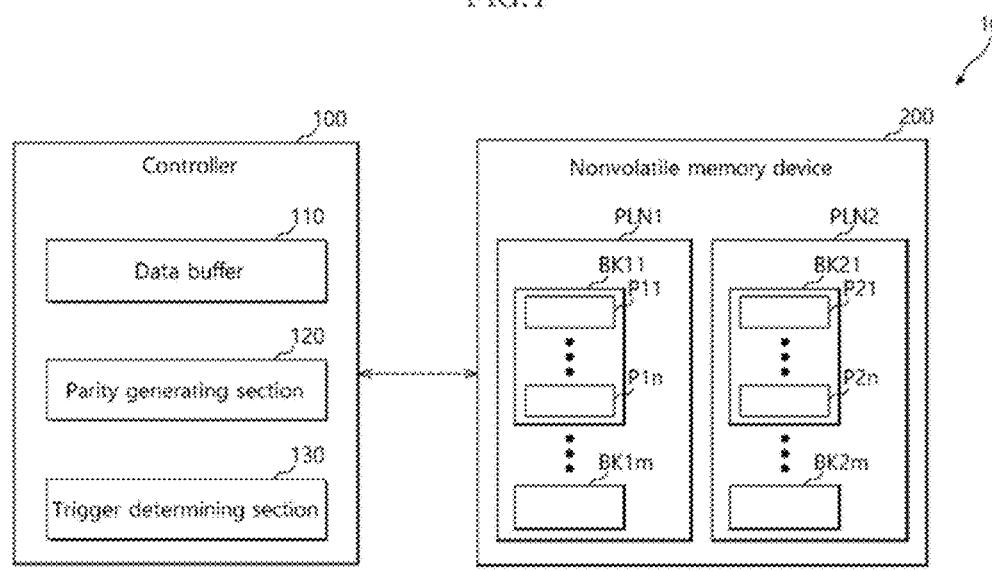
FIG. 1 is a block diagram illustrating a data storage device according to an embodiment of the invention.

Hereinafter, various embodiments of the present invention including a data storage device and an operating method thereof will be described with reference to the accompanying drawings. The present invention may, however, be embodied in different forms and should not be construed as being limited to the embodiments set forth herein. Rather, these embodiments are provided to describe the present invention in detail to the extent that a person skilled in the art to which the invention pertains can practice the present invention.

It is to be understood that embodiments of the present invention are not limited to the particulars shown in the drawings, that the drawings are not necessarily to scale, and, in some instances, proportions may have been exaggerated in order to more clearly depict certain features of the invention. While particular terminology is used, it is to be appreciated that the terminology used is for describing particular embodiments only and is not intended to limit the scope of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or at least one intervening elements may be present. In addition, it will also be understood that when an element is referred to as being "between" two elements, it may be the only element between the two elements, or at least one intervening elements may also be present.

As used herein, singular forms are intended to include the plural forms as well, unless the context clearly indicates otherwise. It will be further understood that the terms "comprises", "comprising", "includes", and "including" when used in this specification, specify the presence of the stated elements and do not preclude the presence or addition of at least one other elements. As used herein, the term "and/or" includes any and all combinations of at least one of the associated listed items.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention will be described in detail with reference to the attached drawings.

FIG. 1 illustrates a data storage device 10 according to an embodiment of the invention.

The data storage device 10 may be configured for storing data provided from an external device, in response to a write request from the external device. Also, the data storage device 10 may be configured to provide stored data to the external device, in response to a read request from the external device.

The data storage device 10 may be configured by one of a Personal Computer Memory Card International Association (PCMCIA) card, a Compact Flash (CF) card, a smart media card, a memory stick, various multimedia cards (MMC, eMMC, RS-MMC, and MMC-Micro), various secure digital cards (SD, Mini-SD, and Micro-SD), a Universal Flash Storage (UFS), a Solid State Drive (SSD) and the like.

The data storage device 10 may include a controller 100 and a nonvolatile memory device 200.

The controller 100 may control the operations of the data storage device 10. For example, the controller 100 may store data in the nonvolatile memory device 200 in response to a write request transmitted from the external device, or may read out data stored in the nonvolatile memory device 200 and output the read-out data to the external device in response to a read request transmitted from the external device.

The controller 100 may include a data buffer 110, a parity generating section 120, and a trigger determining section 130.

The data buffer 110 may store data to be stored in the nonvolatile memory device 200. The data buffer 110 may store write-requested data transmitted from the external device. The data buffer 110 may be a volatile memory device.

The parity generating section 120 may generate parity data for data to be stored in the nonvolatile memory device 200 (i.e., data of the data buffer 110). The parity generating section 120 may generate a plurality of parity data according to respective types of memory regions (e.g., pages), where data of the data buffer 110 are to be stored in the nonvolatile memory device 200.

The trigger determining section 130 may determine whether a predetermined trigger has occurred. For example, the trigger may be a command from the external device or an entry to a predetermined operation mode. The command from the external device may be a command for commanding all data stored in the data buffer 110 (hereinafter, referred to as remaining data) to be moved to the nonvolatile memory device 200. The predetermined operation mode may be a mode in which stability of data stored in the data buffer 110 is not ensured, such as a standby mode, a power-save mode and/or a sleep mode. However, it is to be noted that the embodiment is not limited to only these examples.

The controller 100 may selectively perform a first write operation or a second write operation according to a trigger determination of the trigger determining section 130. The first write operation may be an operation for storing data selected among remaining data of the data buffer 110, in the nonvolatile memory device 200. The second write operation may be an operation for storing remaining data of the data buffer 110 and parity data selected among a plurality of parity data according to the size of the remaining data, in the nonvolatile memory device 200.

The controller 100 may perform the first write operation when it is determined that the predetermined trigger has not occurred. When the size of data selected among remaining data of the data buffer 110 corresponds to a write unit, the controller 100 may store, by the write unit, the selected data in at least one memory region of the nonvolatile memory device 200. The write unit may be a memory unit by which the nonvolatile memory device 200 simultaneously stores data.

The controller 100 may perform the second write operation when it is determined that the predetermined trigger has occurred. The controller 100 may perform the second write operation for storing remaining data in at least one first memory region corresponding to target word lines of the nonvolatile memory device 200 and selectively store parity data in at least one second memory regions corresponding to the target word lines according to the size of the remaining data. The target word lines may be word lines to be accessed when storing remaining data according to a predetermined write sequence in the nonvolatile memory device 200. Also, the target word lines may include word lines where data are stored in only partial memory regions at the time when the trigger has occurred (hereinafter, referred to as unstable word lines).

For example, when the size of remaining data corresponds to the size of empty memory regions coupled to the target word lines, the controller 100 may perform the second write operation by storing only the remaining data in the empty memory regions.

When the size of remaining data is smaller than the size of empty memory regions corresponding to target word lines but the size of the remaining data and selected parity data corresponds to the size of the empty memory regions corresponding to the target word lines, the controller 100 may perform the second write operation by storing the remaining data and the selected parity data in the empty memory regions.

When the size of remaining data and selected parity data is smaller than the size of empty memory regions corresponding to target word lines, the controller 100 may store the remaining data, the selected parity data and dummy data in the empty memory regions.

When remaining data does not exist, the controller 100 may determine whether any unstable target word lines exist. Then, if unstable target word lines exist, the controller 100 may determine whether the size of empty memory regions corresponding to the unstable word lines is sufficient for storing the size of the selected parity and dummy data. If the size of the empty memory regions is sufficient for storing the size of the selected parity and dummy data the controller 100 may then store the selected parity and dummy data in the empty memory blocks.

When performing the second write operation, the controller 100 may select parity data for storing in an empty memory region of the target word lines. The controller 100 may select parity data corresponding to a type of an empty memory region among a plurality of parity data generated according to types of memory regions where data are to be stored in the nonvolatile memory device 200.

According to an embodiment, when remaining data is not divided by the unit of a memory region with no remainder, the controller 100 may perform the second write operation after adding dummy data to the remaining data and thereby causing the remaining data and the dummy data to be divided by the unit of a memory region with no remainder.

According to another embodiment, the controller 100 may store a flag in a memory region of the nonvolatile memory device 200 together with parity data which are stored through the second write operation.

In the following description, as an example, the unit of a memory region of the nonvolatile memory device 200 is a page unit. However, it is to be noted that the embodiment is not limited to such an example.

Summarizing these, the controller 100 may move, by a write unit, data of the data buffer 110 to the nonvolatile memory device 200 through the first write operation before the predetermined trigger occurs, and, when it is determined that the predetermined trigger has occurred, may move all remaining data of the data buffer 110 to the nonvolatile memory device 200 through the second write operation.

Target word lines for which the second write operation is to be performed may include a word line to be accessed when remaining data is stored and an unstable word line where data are stored in only partial pages at the time when the trigger has occurred. The controller 100 fills not only remaining data of the data buffer 110 but also parity data and/or dummy data in empty pages corresponding to the target word lines. As a result, after the second write operation is completed, all pages corresponding to a certain word line may store data or be empty in the nonvolatile memory device 200. In this way, by leaving no empty page for the target word lines, stability of data may be enhanced. Further, by storing parity data rather than simply using only dummy data to leave no empty page for target word lines, operational performance may be improved. This will be described later in detail.

The nonvolatile memory device 200 may store data transmitted from the controller 100 and may read out stored data and transmit read-out data to the controller 100, according to control is of the controller 100.

The nonvolatile memory device 200 may include a flash memory, such as a NAND flash or a NOR flash, a Ferroelectrics Random Access Memory (FeRAM), a Phase-Change Random Access Memory (PCRAM), a Magnetoresistive Random Access Memory (MRAM), a Resistive Random Access Memory (ReRAM), and the like.

The nonvolatile memory device 200 may include a plurality of planes, for example planes PLN1 and PLN2. The planes PLN1 and PLN2 may include a plurality of memory cells which store data. While it is illustrated in FIG. 1 that the nonvolatile memory device 200 includes 2 planes PLN1 and PLN2, it is to be noted that the embodiment is not limited to such and a greater number of planes may also be used.

The plane PLN1 may include a plurality of memory blocks BK11 to BK1m. Each of the memory blocks BK11 to BK1m may include a plurality of pages P11 to P1n. The plane PLN2 may be configured in substantially the same manner as the plane PLN1.

While FIG. 1 illustrates one nonvolatile memory device 200, the data storage device 10 may include a plurality of nonvolatile memory devices.

Figure 2:
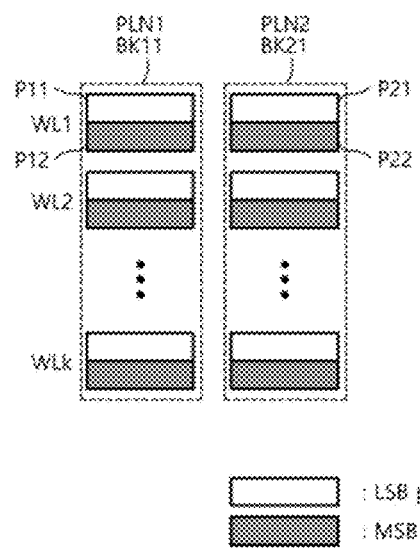
FIG. 2 is a diagram illustrating memory blocks shown in FIG. 1.

FIG. 2 is a diagram illustrating memory blocks BK11 and BK21 of the nonvolatile memory device 200 shown in FIG. 1.

Figure 12:
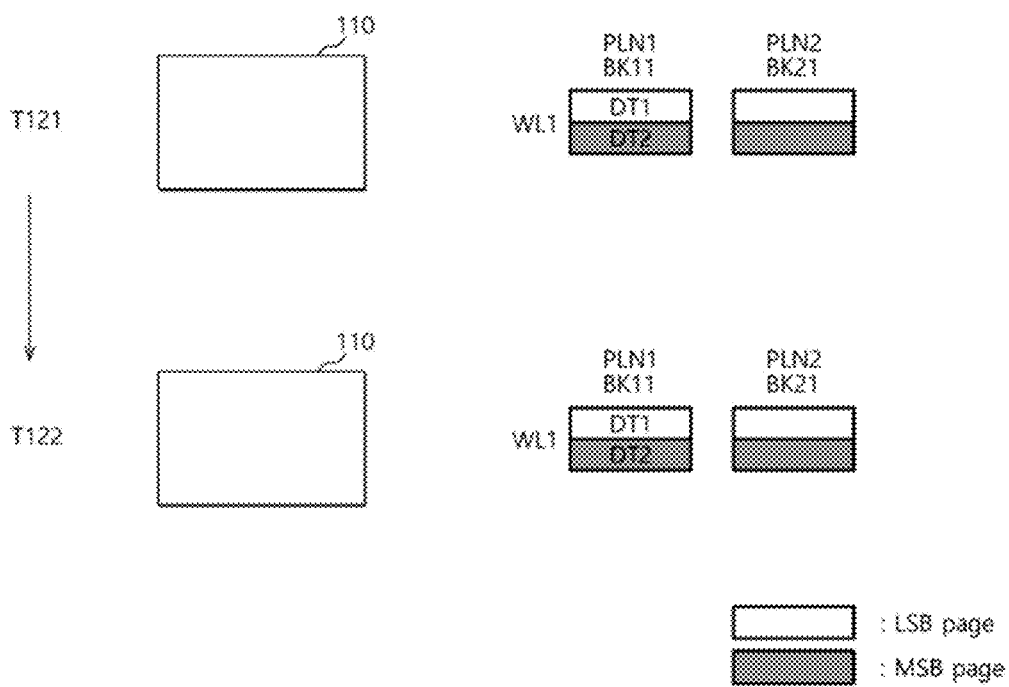

The nonvolatile memory device 200 may access a plurality of pages included in each of the memory blocks BK11 and BK21 through a plurality of word lines WL1 to WLk. In other words, each of the pages may be accessed through a word line. As illustrated in FIG. 12, as an example, pages P11 and P12 may be accessed through the word line WL1 of the memory block BK11, and pages P21 and P22 may be accessed through the word line WL1 of the memory block BK21.

A single word line may correspond to a plurality of pages, based on the number of bits which are stored by each of a plurality of memory cells coupled to the word line. For example, when 2-bit data is stored in each memory cell, a single word line may correspond to 2 pages including a least significant bit (LSB) page and a most significant bit (MSB) page. The LSB page may store a lower bit which is stored in each memory cell, and the MSB page may store an upper bit which is stored in each memory cell. While it is assumed, as an example for illustration purposes only, in the following descriptions that a single word line corresponds to 2 pages as LSB and MSB pages, it is to be noted that the embodiment is not limited to such a configuration.

The nonvolatile memory device 200 may perform a write operation by various write units. A write unit may be a memory unit by which the nonvolatile memory device 200 simultaneously stores data.

When a write unit is a page unit, a write operation may be performed for only one page (e.g., the page P11). When a write unit is a multi-plane unit, a write operation may be performed simultaneously for pages (e.g., the pages P11 and P21) having the same offset value in the memory blocks BK11 and BK21. When a write unit is a single plane one-shot unit, a write operation may be performed simultaneously for all the pages corresponding to a single word line in a single plane (e.g., the pages P11 and P12). When a write unit is a multi-plane one-shot unit, a write operation may be performed simultaneously for all the pages corresponding to word lines having the same offset value in a multi-plane (e.g., the pages P11, P12, P21 and P22).

The controller 100 may control a write unit when storing data in the nonvolatile memory device 200. For storing data stored in the data buffer 110, in the nonvolatile memory device 200, at a high speed, the controller 100 may control the nonvolatile memory device 200 to perform a write operation by a large write unit.

Figure 3:
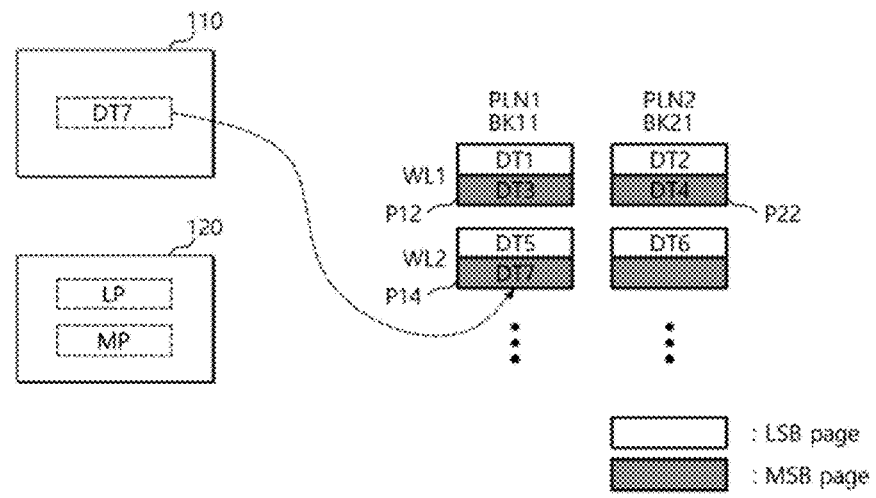
FIG. 3 is a diagram illustrating an operating method of the parity generating section shown in FIG. 1.

FIG. 3 is a diagram illustrating an operating method of the parity generating section 120 shown in FIG. 1.

The parity generating section 120 may generate LSB parity data LP and MSB parity data MP according to the page type (LSB page or MSB page) where the data of the data buffer 110 is to be stored in the nonvolatile memory device 200. For example, the parity generating section 120 may generate LSB parity data LP for data to be stored in an LSB page, whereas the parity generating section 120 may generate MSB parity data MP for data to be stored in an MSB page.

The parity generating section 120 may update LSB parity data LP or MSB parity data MP each time when data to be stored in the nonvolatile memory device 200 is additionally acquired. For example, when there exists data DT7 to be stored in an MSB page P14, the parity generating section 120 may generate new MSB parity data MP based on the data DT7 and MSB parity data MP previously generated for data DT3 and DT4 stored in MSB pages P12 and P22, respectively.

As a result, LSB parity data LP may be generated for data DT1, DT2, DT5 and DT6 stored in LSB pages, and MSB parity data MP may be generated for data DT3, DT4 and DT7 stored in MSB pages.

According to an embodiment, when the data storage device 10 includes a plurality of nonvolatile memory devices, LSB parity data may be generated for data stored in LSB pages of the plurality of nonvolatile memory devices, and MSB parity data may be generated for data stored in MSB pages of the plurality of nonvolatile memory devices.

Figure 4:
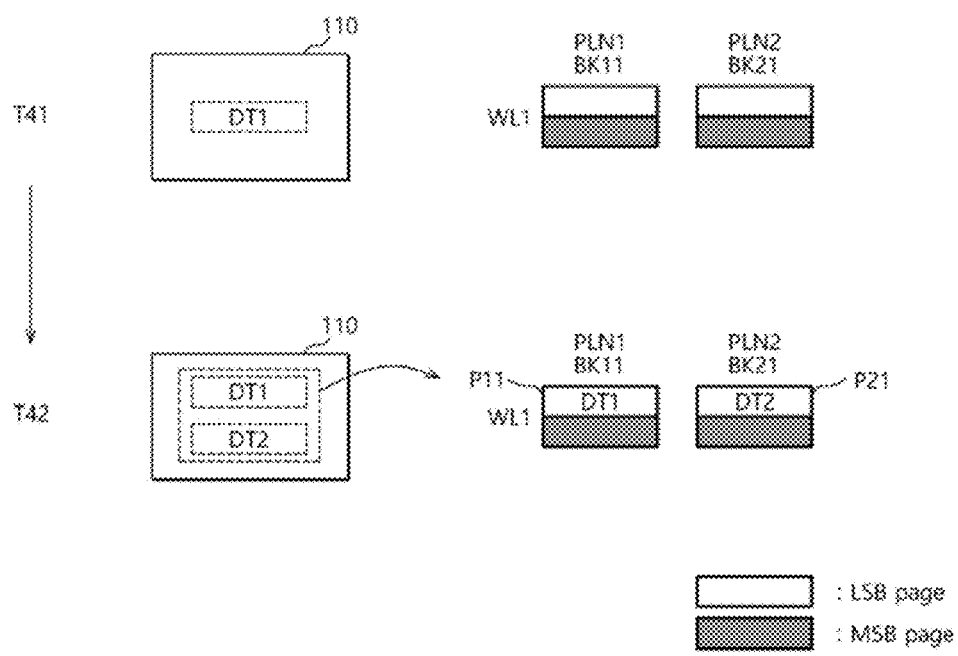
FIG. 4 is a diagram illustrating a method for the controller of FIG. 1 to perform a first write operation.

FIG. 4 is a diagram illustrating a method for the controller 100 of FIG. 1 to perform the first write operation. In FIGS. 4 to 9, it is assumed, as an example for illustration purposes only, that the controller 100 stores data in the multi-plane unit in the nonvolatile memory device 200.

Referring to FIG. 4, at a state T41, when remaining data DT1 exists in the data buffer 110, the controller 100 may not store the remaining data DT1 which does not correspond to the multi-plane unit, in the nonvolatile memory device 200.

At a state T42, after data DT2 is stored in the data buffer 110, the controller 100 may store simultaneously the data DT1 and DT2 which correspond to the multi-plane unit, in pages P11 and P21, respectively. The controller 100 may store the data DT1 and DT2 in the pages P11 and P21 according to a write sequence which is a sequence in which pages of the nonvolatile memory device 200 are to be written.

Figure 5:
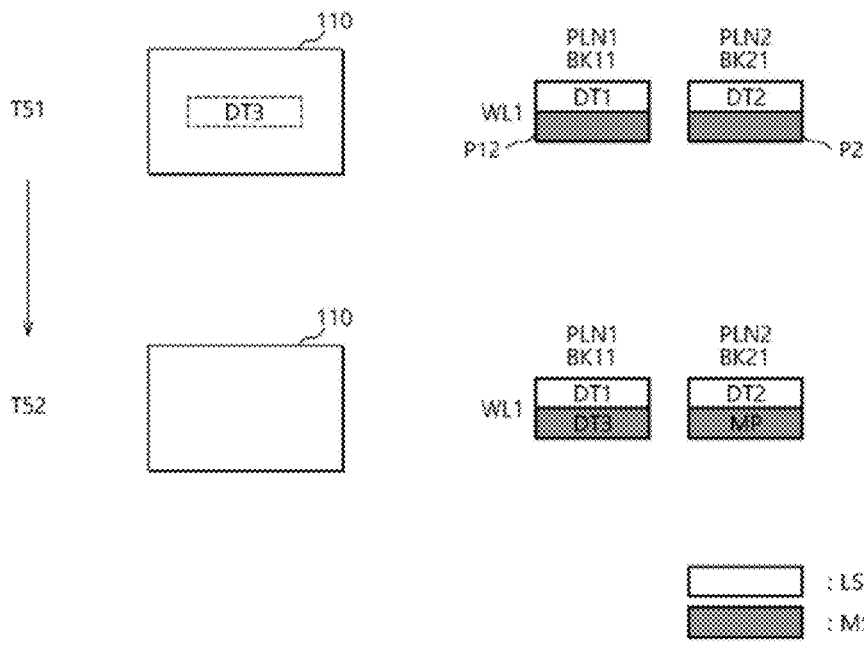
FIGS. 5 to 12 are diagrams illustrating methods for the controller of FIG. 1 to perform a second write operation.

FIG. 5 is a diagram illustration of a method for the controller 100 of FIG. 1 to perform the second write operation.

Referring to FIG. 5, at a state T51, when remaining data DT3 exists in the data buffer 110, the controller 100 may determine that the predetermined trigger has occurred.

At a state T52, when the predetermined trigger has occurred, the controller 100 may store the remaining data DT3 in the nonvolatile memory device 200 through the second write operation. Target word lines for which the second write operation is to be performed may include the word line WL1 of the memory block BK11 to be accessed according to the write sequence to allow the remaining data DT3 to be stored. Also, the target word lines may include the word line WL1 of the memory block BK21 which is unstable at the time when the trigger has occurred. That is to say, at the time when the trigger has occurred, since data DT2 is stored partially in only an LSB page between LSB and MSB pages corresponding to the word line WL1 of the memory block BK21, the word line WL1 of the memory block BK21 is an unstable word line and may be a target word line for the second write operation.

Accordingly, the controller 100 may store simultaneously the remaining data DT3 and selected parity data MP in empty pages P12 and P22 of the target word lines WL1 of the memory blocks BK11 and BK21, respectively. In other words, the controller 100 may store the MSB parity data MP corresponding to the page type of the empty page P22 (e.g., MSB page) in the empty page P22, so that no empty page is left for the target word lines WL1.

In the case where the controller 100 stores the MSB parity data MP in the nonvolatile memory device 200 through the second write operation, the controller 100 may generate subsequently new MSB parity data for data to be stored in MSB pages of the nonvolatile memory device 200.

Figure 6:
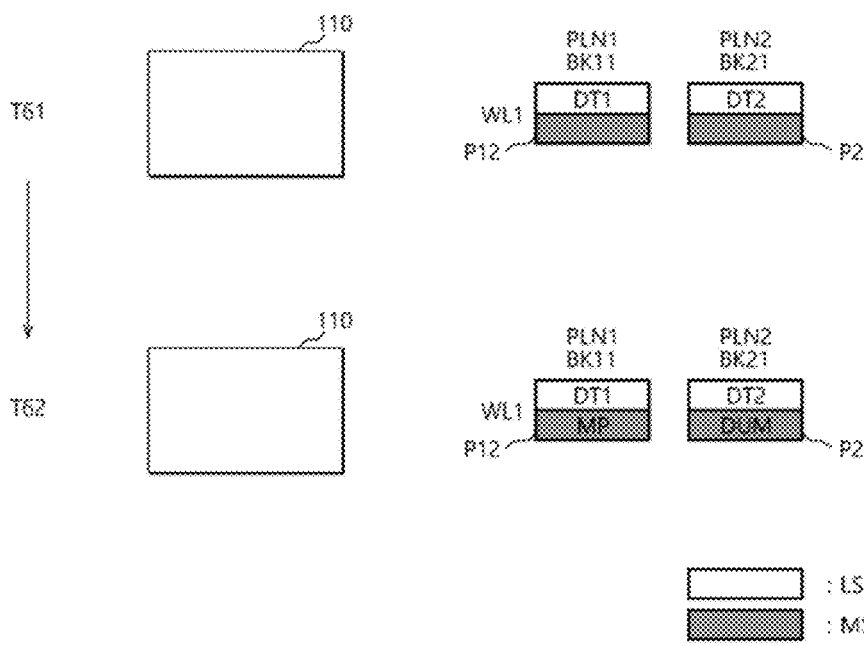

FIG. 6 is a diagram illustration of a method for the controller 100 of FIG. 1 to perform the second write operation.

Referring to FIG. 6, at a state T61, when no remaining data exists in the data buffer 110, the controller 100 may determine that the predetermined trigger has occurred.

At a state T62, when the predetermined trigger has occurred, the controller 100 may perform the second write operation for target word lines which are unstable word lines WL1 of the memory blocks BK11 and BK21. That is to say, at the time when the trigger has occurred, since data DT1 and DT2 are stored partially in only LSB pages among LSB and MSB pages corresponding to the word lines WL1 of the memory blocks BK11 and BK21, the word lines WL1 of the memory blocks BK11 and BK21 are unstable word lines and may be target word lines for the second write operation.

Accordingly, the controller 100 may store simultaneously MSB parity data MP corresponding to the page type of an empty page P12 and dummy data DUM in empty pages P12 and P22 so that no empty page is left for the target word lines WL1 of the memory blocks BK11 and BK21.

Figure 7:
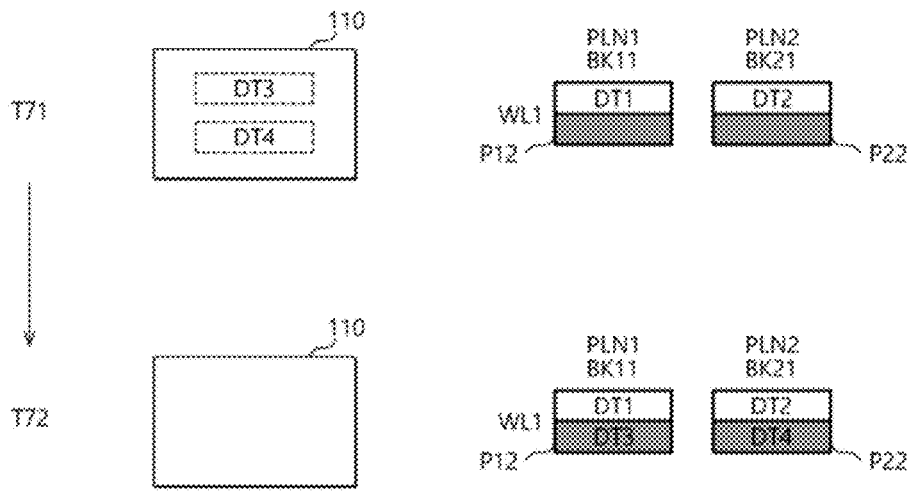

FIG. 7 is an illustration of a method for the controller 100 of FIG. 1 to perform the second write operation.

Referring to FIG. 7, at a state T71, when remaining data DT3 and DT4 exist in the data buffer 110, the controller 100 may determine that the predetermined trigger has occurred.

At a state T72, when the predetermined trigger has occurred, the controller 100 may store the remaining data DT3 and DT4 in the nonvolatile memory device 200 through the second write operation. Target word lines for which the second write operation is to be performed may include the word lines WL1 of the memory blocks BK11 and BK21 to be accessed according to the write sequence to allow the remaining data DT3 and DT4 to be stored. Since the size of the remaining data DT3 and DT4 corresponds to the size of empty pages P12 and P22 corresponding to the target word lines WL1, the controller 100 may perform the second write operation by storing simultaneously the remaining data DT3 and DT4 in the empty pages P12 and P22, respectively.

Figure 8:
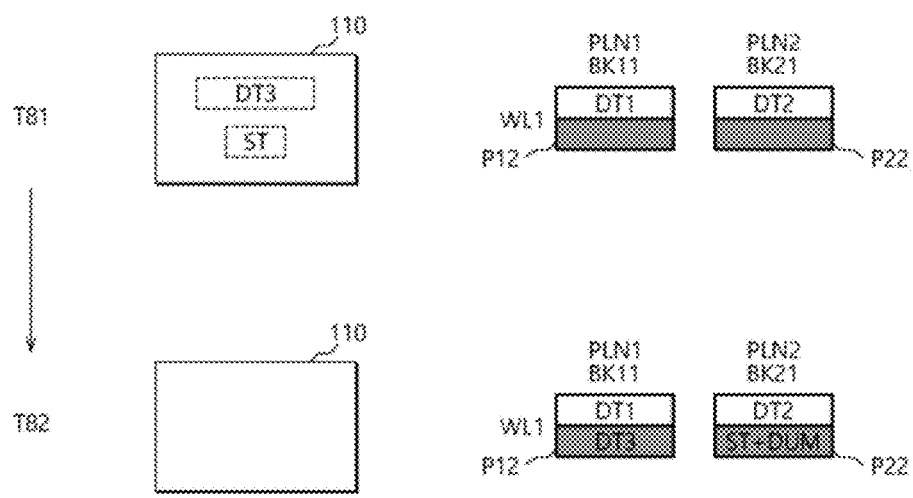

FIG. 8 is an illustration of a method for the controller 100 of FIG. 1 to perform the second write operation.

Referring to FIG. 8, at a state T81, when remaining data DT3 and ST exist in the data buffer 110, the controller 100 may determine that the predetermined trigger has occurred. When the size of the data ST is smaller than the page unit, the remaining data DT3 and ST may not be divided by the page unit.

At a state T82, when the predetermined trigger has occurred, the controller 100 may store the remaining data DT3 and ST in the nonvolatile memory device 200 through the second write operation. In detail, the controller 100 may cause the remaining data DT3 and ST to be divided by the page unit with no remainder by adding dummy data DUM to the remaining data DT3, and may then store the sum of the remaining data DT3 and ST together with the Dummy data DUM in empty pages P12 and P22 corresponding to the target word lines WL1 of the memory blocks BK11 and BK21, respectively.

Figure 9:
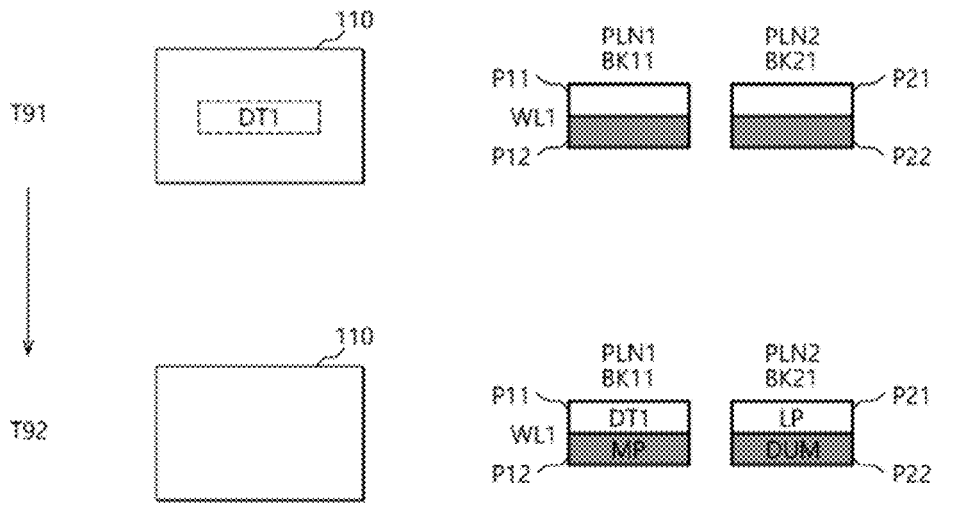

FIG. 9 is a diagram illustration of a method for the controller 100 of FIG. 1 to perform the second write operation.

Referring to FIG. 9, at a state T91, when remaining data DT1 exists in the data buffer 110, the controller 100 may determine that the predetermined trigger has occurred.

At a state T92, when the predetermined trigger has occurred, the controller 100 may store the remaining data DT1 in the nonvolatile memory device 200 through the second write operation. Target word lines for which the second write operation is to be performed may include the word line WL1 of the memory block BK11 vs to be accessed according to the write sequence to allow the remaining data DT1 to be stored. Also, since the controller 100 accesses simultaneously the word lines WL1 of the memory blocks BK11 and BK21 when storing the data DT1 in the multiplane unit, the target word lines may include the word line WL1 of the memory block BK21.

Accordingly, the controller 100 may store simultaneously the remaining data DT1 and LSB parity data LP in empty pages P11 and P21 of the target word lines WL1 of the memory blocks BK11 and BK21, respectively. Moreover, the controller 100 may store simultaneously MSB parity data MP and dummy data DUM in empty pages P12 and P22 of the target word lines WL1 of the memory blocks BK11 and BK21, respectively. In other words, the controller 100 may store the LSB and MSB parity data LP and MP corresponding to the respective page types of the empty pages P21 and P12 and the dummy data DUM, in the empty pages P21, P12 and P22, respectively, so that no empty page is left for the target word lines WL1.

Figure 10:
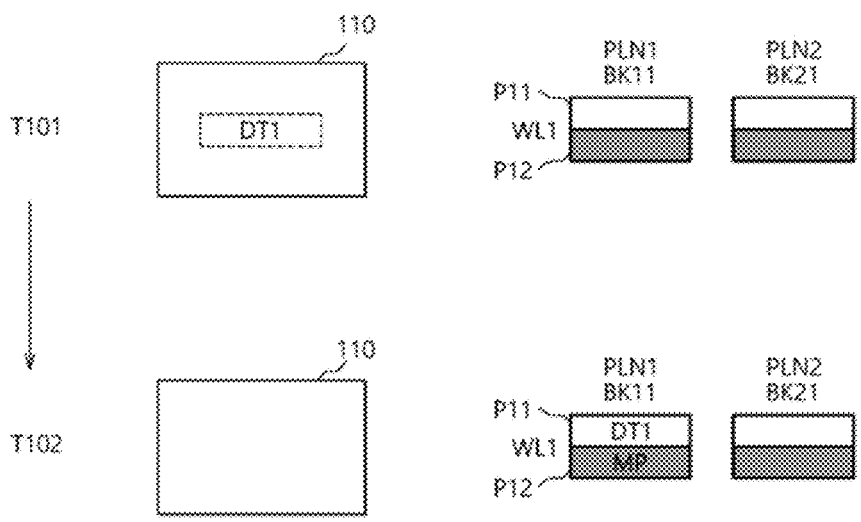

FIG. 10 is an illustration of a method for the controller 100 of FIG. 1 to perform the second write operation. In FIGS. 10 to 13, it is assumed that the controller 100 stores data in the single plane one-shot unit in the nonvolatile memory device 200.

Referring to FIG. 10, at a state T101, when remaining data DT1 exists in the data buffer 110, the controller 100 may determine that the predetermined trigger has occurred.

At a state T102, when the predetermined trigger has occurred, the controller 100 may store the remaining data DT1 in the nonvolatile memory device 200 through the second write operation. A target word line for which the second write operation is to be performed may be the word line WL1 of the memory block BK11 to be accessed according to the write sequence to allow the remaining data DT1 to be stored.

Accordingly, the controller 100 may store simultaneously the remaining data DT1 and selected parity data MP in empty pages P11 and P12 of the target word line WL1 of the memory block BK11, respectively. In other words, the controller 100 may store the MSB parity data MP corresponding to the type of the empty page P12, in the empty page P12, so that no empty page is left for the target word line WL1 of the memory block BK11.

Figure 11:
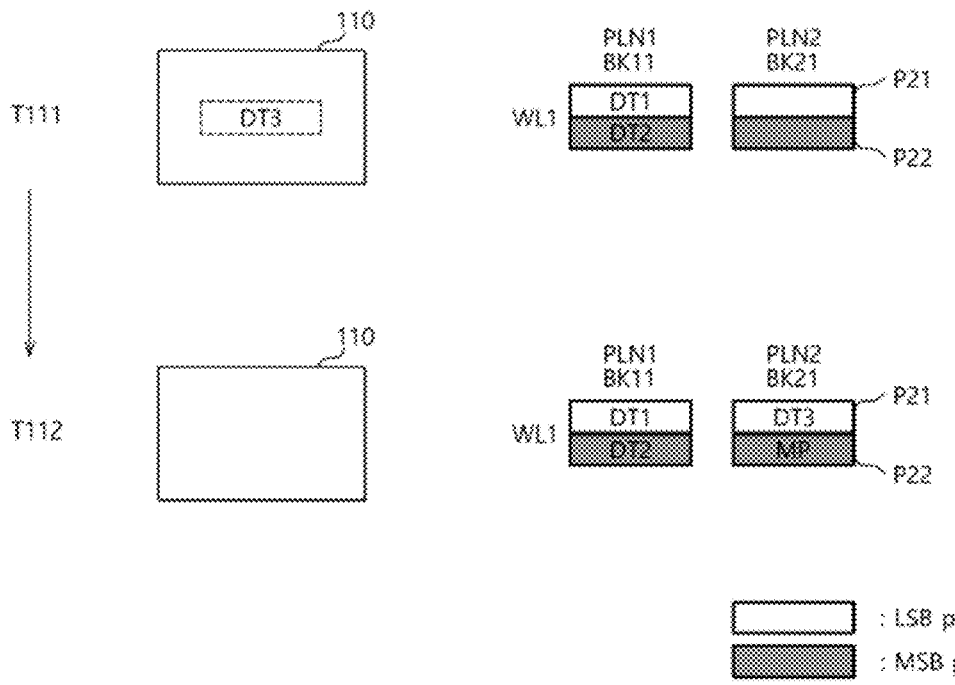

FIG. 11 is a diagram illustration of a method for the controller 100 of FIG. 1 to perform the second write operation.

Referring to FIG. 11, at a state T111, when remaining data DT3 exists in the data buffer 110, the controller 100 may determine that the predetermined trigger has occurred.

At a state T112, when the predetermined trigger has occurred, the controller 100 may store the remaining data DT3 in the nonvolatile memory device 200 through the second write operation. A target word line for which the second write operation is to be performed may be the word line WL1 of the memory block BK21 to be accessed to allow the remaining data DT3 to be stored.

Accordingly, the controller 100 may store simultaneously the remaining data DT3 and selected parity data MP in empty pages P21 and P22 of the target word line WL1 of the memory block BK21, respectively. In other words, the controller 100 may store the MSB parity data MP corresponding to the type of the empty page P22, in the empty page P22, so that no empty page is left for the target word line WL1 of the memory block BK21.

FIG. 12 is a diagram illustration of a method for the controller 100 of FIG. 1 to perform the second write operation.

Referring to FIG. 12, at a state T121, when no remaining data exists in the data buffer 110, the controller 100 may determine that the predetermined trigger has occurred.

At a state T122, because no remaining data exists in the data buffer 110 and no unstable word line exists at the time when the trigger has occurred, the controller 100 may not perform the second write operation.

Figure 13:
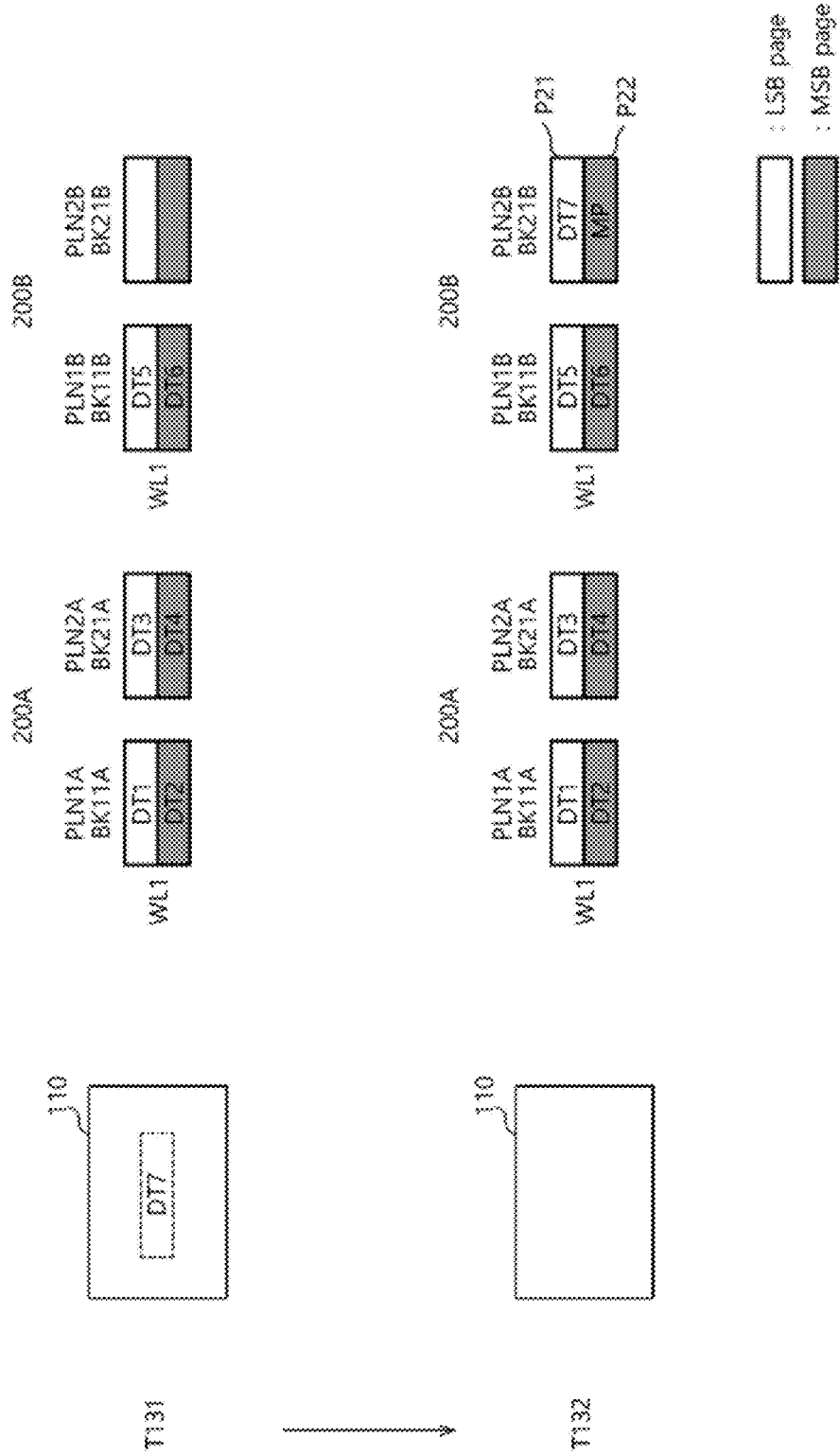
FIG. 13 is a diagram illustrating a method for the controller to perform a second write operation when the data storage device of FIG. 1 includes first and second nonvolatile memory devices.

FIG. 13 is a diagram illustration of a method for the controller 100 to perform the second write operation when the nonvolatile memory device 200 of the data storage device 10 of FIG. 1 includes first and second nonvolatile memory devices 200A and 200B.

Referring to FIG. 13, at a state T131, when remaining data DT7 exists in the data buffer 110, the controller 100 may determine that the predetermined trigger has occurred.

At a state T132, when the predetermined trigger has occurred, the controller 100 may store the remaining data DT7 in an empty page P21 the target word line WL1 of the memory block BK21B of the second nonvolatile memory device 200B through the second write operation. Simultaneously, the controller 100 may store selected parity data MP in an empty page P22 of the target word line WL1 of the memory block BK21B of the second nonvolatile memory device 200B. The operating method of the controller 100 may be substantially the same as the operating method of the controller 100 described above with reference to FIG. 11.

Namely, when the controller 100 stores data in a plurality of nonvolatile memory devices, only a write sequence for storing the data is controlled according to an interleaving scheme among the plurality of the nonvolatile memory devices. The method of performing the second write operation may be substantially similar to the methods described above with reference to FIGS. 5 to 12.

While descriptions were made above for the cases in which data are stored in a multi-plane unit or a single-plane, one-shot unit, substantially the same operating methods as the above-described operating methods may be performed even in the cases in which data are stored in the page unit or the multi-plane one-shot unit.

Figure 14:
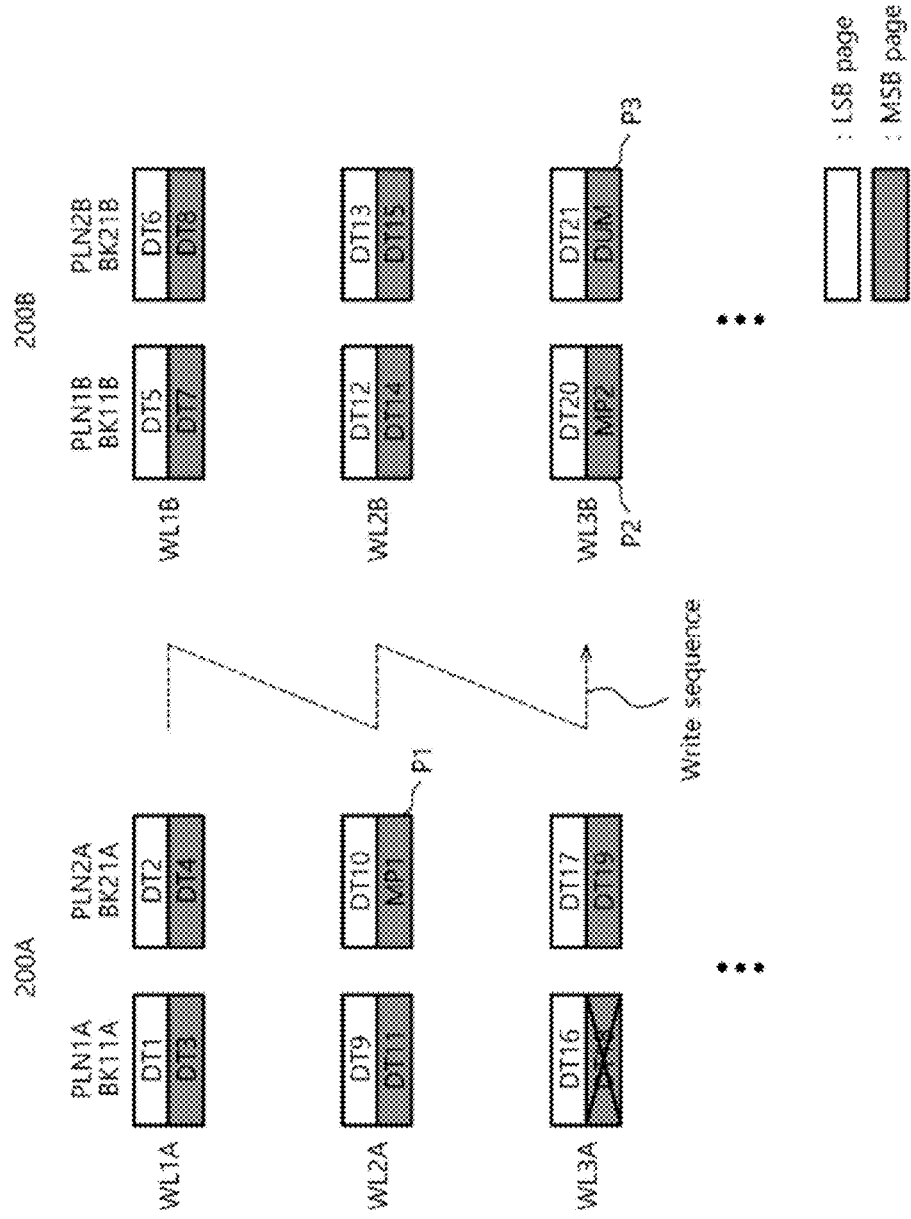
FIG. 14 is a diagram illustrating a method for the controller of FIG. 1 to utilize parity data stored in first and second nonvolatile memory devices through a second write operation.

FIG. 14 is a diagram illustration of a method for the controller 100 of FIG. 1 for employing parity data stored in first and second nonvolatile memory devices 200A and 200B through the second write operation. The nonvolatile memory device 200 of the data storage device 10 of FIG. 1 may include first and second nonvolatile memory devices 200A and 200B. In FIG. 14, it is assumed that data are stored in the multi-plane, one-shot unit.

Referring to FIG. 14, MSB parity data MP1 generated for data DT3, DT4, DT7, DT8 and DT11 may be stored in a page P1 of the memory block BK21A of the first nonvolatile memory device 200A 20o through the second write operation, and MSB parity data MP2 generated for data DT14, DT15, DT18 and DT19 may be stored in a page P2 of the memory block BK11B of the second nonvolatile memory device 200B through the second write operation. Moreover, with storing the MSB parity data MP2, the controller 100 may store dummy data DUM in an empty page P3 of the target word lines WL3B of the memory block BK21B. In other words, the controller 100 may store the MSB parity data MP1 and MP2 and the dummy data DUM, in the empty pages P1, P2 and P3, respectively, so that no empty page is left for the target word lines WL2A and WL3B.

The controller 100 may determine that data DT18 includes an error bit. Therefore, the controller 100 may perform an error correction operation for the data DT18 by reading the MSB parity data MP2 and reading remaining data DT14, DT15 and DT19 which share the MSB parity data MP2 with the data DT18. More specifically, the controller 100 may acquire the remaining data DT14, DT15 and DT19 by reading data stored in MSB pages before and after the data DT18 until the MSB parity data MP1 and MP2 are read. The controller 100 may be aware of that the MSB parity data MP1 and MP2 are read from the pages P1 and P2, through flags stored in the pages P1 and P2.

Summarizing these, because the controller 100 not only stores dummy data but also stores together parity data to fill empty pages for a target word line when performing the second write operation and the parity data is newly generated, a decreased number of data may be read when performing an error correction operation. Therefore, the controller 100 may perform the error correction operation at a high speed.

Figure 15:
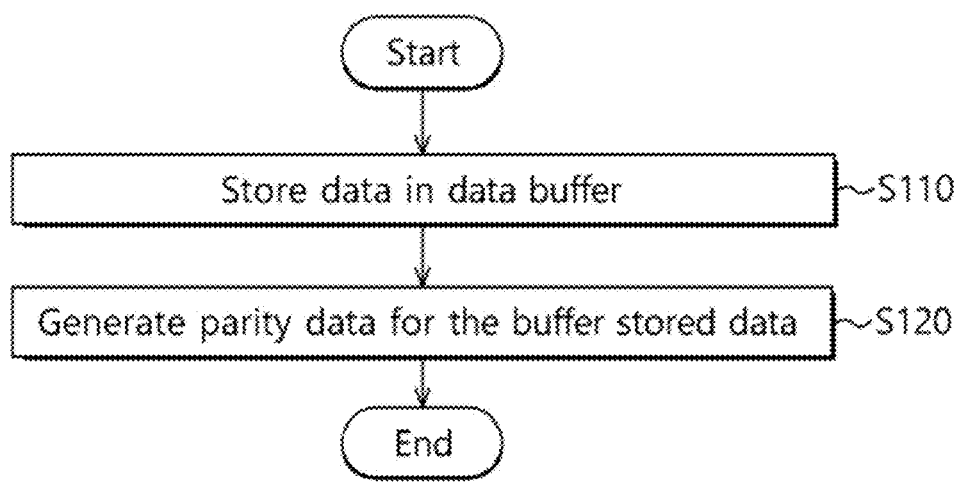
FIG. 15 is a flow chart illustrating a method for operating the data storage device of FIG. 1, according to an embodiment of the invention.

FIG. 15 is a flow chart illustrating a method for operating the data storage device 10 of FIG. 1. Referring to FIG. 15, there is shown an exemplary method for the controller 100 to manage data in the controller 100.

At step S110, the controller 100 may store data to be stored in the nonvolatile memory device 200, in the data buffer 110. For example, the data may be received from the external device (e.g., host device).

At step S120, the controller 100 may generate parity data for the data stored in the data buffer 110. The controller 100 may generate a plurality of parity data according to the respective page types of the pages where data are to be stored. That is to say, data to be stored in the same type of pages may share parity data.

Figure 16:
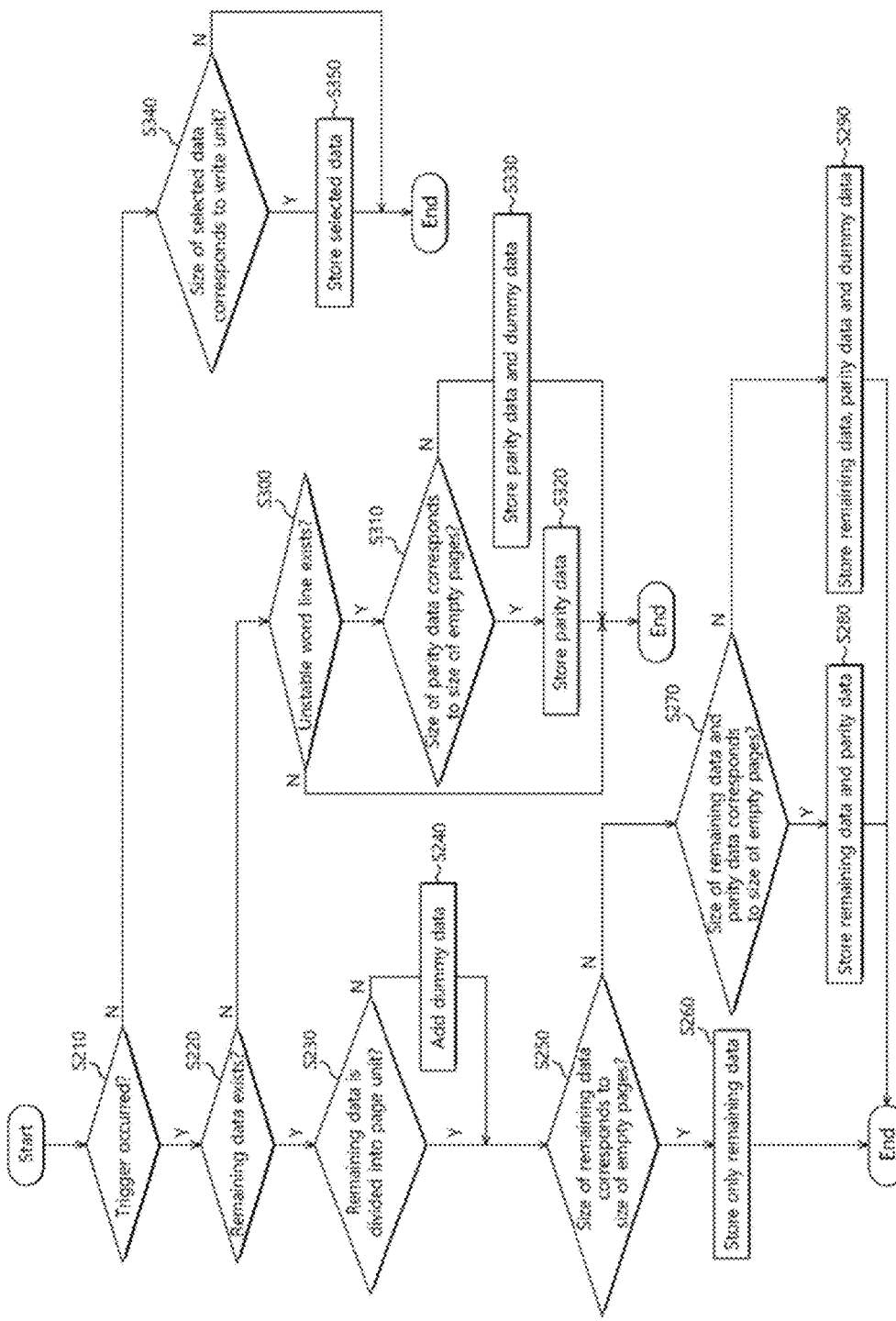
FIG. 16 is a flow chart illustrating a method for operating the data storage device of FIG. 1, according to another embodiment of the invention.

FIG. 16 is a flow chart illustrating a method for operating the data storage device 10 of FIG. 1. Referring to FIG. 16, there is shown an exemplary method for the controller 100 for storing data of the data buffer 110 in the nonvolatile memory device 200. The controller 100 may store data which are stored temporarily in data buffer 110 in the nonvolatile memory device 200 through a first write operation S350 or a second write operation S260, S280, S290, S320 or S330.

At step S210, the controller 100 may determine whether a predetermined trigger has occurred. When it is determined that the trigger has occurred, the process may proceed to step S220. When it is determined that the trigger has not occurred, the process may proceed to step S340.

At step S220, the controller 100 may determine whether remaining data exists in the data buffer 110. When remaining data exists, the process may proceed to step S230. When remaining data does not exist, the process may proceed to step S300.

At step S230, the controller 100 may determine whether the remaining data is divided by a page unit with no remainder. For example, when the page unit is 16 Kbyte, the controller 100 may determine that the remaining data of 30 Kbyte is not divided by the page unit with no remainder. For example, when the page unit is 16 Kbyte, the controller 100 may determine that the remaining data of 32 Kbyte is divided by the page unit with no remainder. When the remaining data is not divided by the page unit with no remainder, the process may proceed to step S240. When the remaining data is divided by the page unit with no remainder, the process may proceed to step S250.

At step S240, the controller 100 may add dummy data to the remaining data so that the remaining data may be divided by the page unit with no remainder.

At step S250, the controller 100 may determine whether the size of the remaining data corresponds to the size of empty pages corresponding to target word lines. In other words, the controller 100 may determine whether the size of the remaining data is equal to the size of empty pages corresponding to target word lines. The target word lines may include a word line to be accessed when the remaining data is stored and an unstable word line at the time when the trigger has occurred. When the size of the remaining data corresponds to the size of the empty pages, the process may proceed to step S260. When the size of the remaining data does not correspond to the size of the empty pages, that is, when the size of the remaining data is smaller than the size of the empty pages, the process may proceed to step S270.

At step S260, the controller 100 may store only the remaining data in the empty pages corresponding to the target word lines.

At step S270, the controller 100 may determine whether the size of the remaining data and selected parity data corresponds to the size of the empty pages corresponding to the target word lines. In other words, the controller 100 may determine whether the size of the remaining data and selected parity data is equal to the size of the empty pages corresponding to the target word lines. The selected parity data may be selected among a plurality of parity data in correspondence to the respective types of the empty pages corresponding to the target word lines. When the size of the remaining data and the selected parity data corresponds to the size of the empty pages, the process may proceed to step S280. When the size of the remaining data and the selected parity data does not correspond to the size of the empty pages, that is, when the size of the remaining data and the selected parity data is smaller than the size of the empty pages, the process may proceed to step S290.

At step S280, the controller 100 may store the remaining data and the selected parity data in the empty pages corresponding to the target word lines.

At step S290, the controller 100 may store the remaining data, the selected parity data and dummy data in the empty pages corresponding to the target word lines.

At step S300, the controller 100 may determine whether a there exists a target word line which is an unstable word line at the time when the trigger occurs. When an unstable word line does not exist, the process may be ended. When an unstable word line exists, the process may proceed to step S310.

At step S310, the controller 100 may determine whether the size of selected parity data corresponds to the size of empty pages corresponding to target word lines. In other words, the controller 100 may determine whether the size of selected parity data is equal to the size of empty pages corresponding to target word lines. The selected parity data may be selected among a plurality of parity data in correspondence to the respective types of the empty pages corresponding to the target word lines. When the size of the selected parity data corresponds to the size of the empty pages, the process may proceed to step S320. When the size of the selected parity data does not correspond to the size of the empty pages, that is, when the size of the selected parity data is smaller than the size of the empty pages, the process may proceed to step S330.

At step S320, the controller 100 may store the selected parity data in the empty pages corresponding to the target word lines.

At step S330, the controller 100 may store the selected parity data and dummy data in the empty pages corresponding to the target word lines.

At step S340, the controller 100 may determine whether the size of data selected among the remaining data corresponds to a write unit. In other words, the controller 100 may determine whether the size of data selected among the remaining data is equal to a write unit. A write unit may be a unit of a memory region by which the nonvolatile memory device 200 simultaneously stores data. When the size of the selected data does not correspond to the write unit, that is, when the size of the selected data is smaller than the write unit, the process may be ended. When the size of the selected data corresponds to the write unit, the process may proceed to step S350.

At step S350, the controller 100 may store, by the write unit, the selected data in empty pages of the nonvolatile memory device 200.

Figure 17:
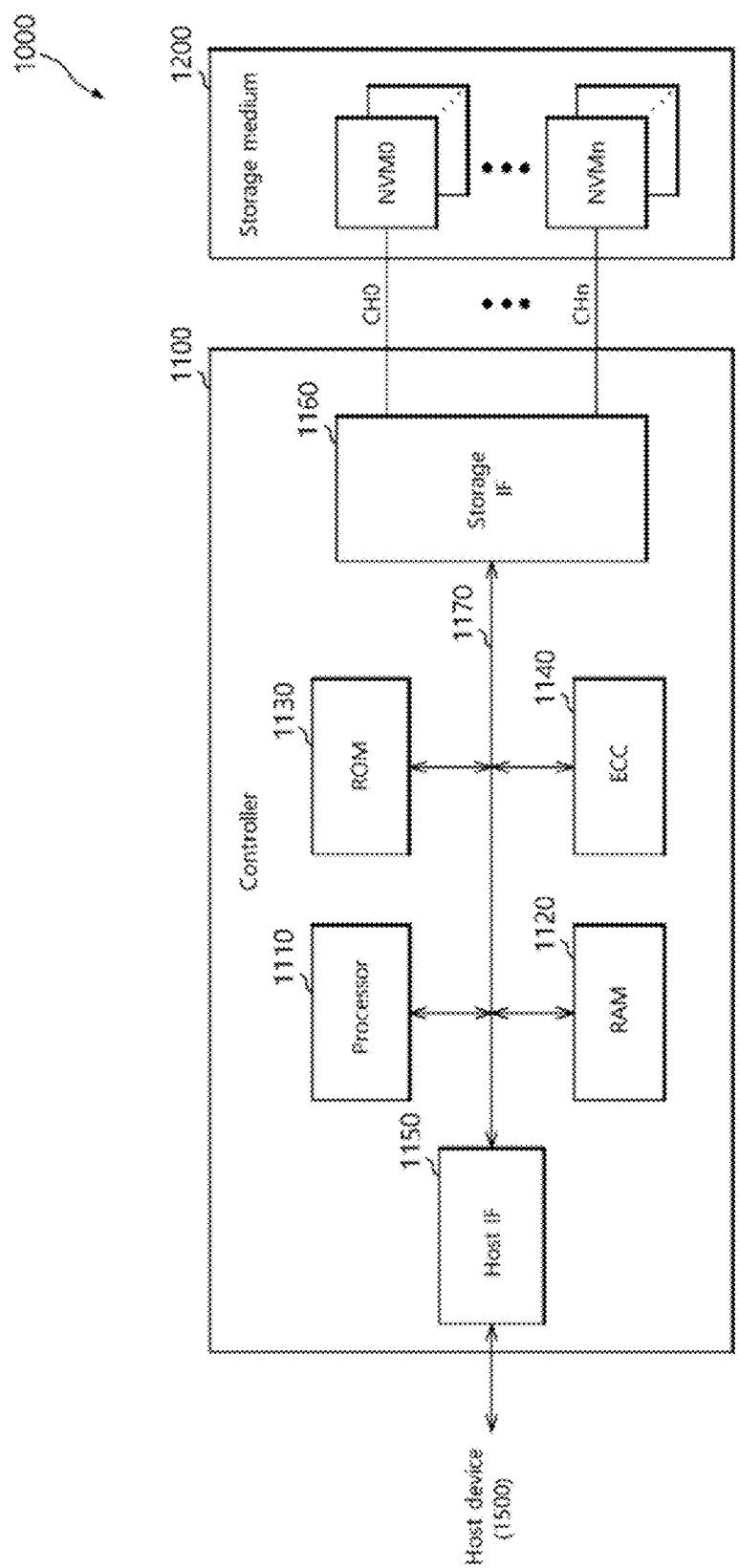
FIG. 17 is a block diagram illustrating a solid state drive (SSD) according to an embodiment of the invention.

FIG. 17 is a block diagram illustrating a solid state drive (SSD) 1000, according to an embodiment of the invention.

The SSD 1000 may include a controller 1100 and a storage medium 1200.

The controller 1100 may control data exchange between a host device 1500 and the storage medium 1200. The controller 1100 may include a processor 1110, a random access memory (RAM) 1120, a read only memory (ROM) 1130, an error correction code (ECC) unit 1140, a host interface 1150, and a storage medium interface 1160.

The controller 1100 may operate in substantially the same manner as the controller 100 of FIG. 1. The controller 1100 may selectively perform a first write operation and a second write operation according to a trigger determination. The controller 1100 may perform the first write operation for storing data selected among remaining data of the RAM 1120, in a nonvolatile memory device of the storage medium 1200. Also, the controller 1100 may perform the second write operation for storing remaining data of the RAM 1120 and parity data selected among a plurality of parity data according to a size of the remaining data, in the nonvolatile memory device.

The processor 1110 may control the operations of the controller 1100. The processor 1110 may store data in the storage medium 1200 and read stored data from the storage medium 1200, according to data processing requests received from the host device 1500. In order to efficiently manage the storage medium 1200, the processor 1110 may control the internal operations of the SSD 1000, such as, for example, a merge operation, a wear leveling operation, and so forth.

The RAM 1120 may store programs and program data to be used by the processor 1110. The RAM 1120 may temporarily store data received from the host interface 1150 before transferring them to the storage medium 1200, and may temporarily store data received from the storage medium 1200 before transferring them to the host device 1500.

The ROM 1130 may store program codes to be read by the processor 1110. The program codes may include commands to be processed by the processor 1110 for the processor 1110 to control the internal units of the controller 1100.

The ECC unit 1140 may encode data to be stored in the storage medium 1200, and may decode data read from the storage medium 1200. The ECC unit 1140 may detect and correct data errors according to an ECC algorithm. Any suitable error detection algorithm may be used.

The host interface 1150 may exchange data processing requests, data, etc. with the host device 1500.

The storage medium interface 1160 may transmit control signals and data to the storage medium 1200. The storage medium interface 1160 may receive data from the storage medium 1200. The storage medium interface 1160 may be coupled with the storage medium 1200 through a plurality of channels CH0 to CHn.

The storage medium 1200 may include a plurality of nonvolatile memory devices NVM0 to NVMn. Each of the plurality of nonvolatile memory devices NVM0 to NVMn may perform an operation, for example, a write operation or a read operation according to the control of the controller 1100.

Figure 18:
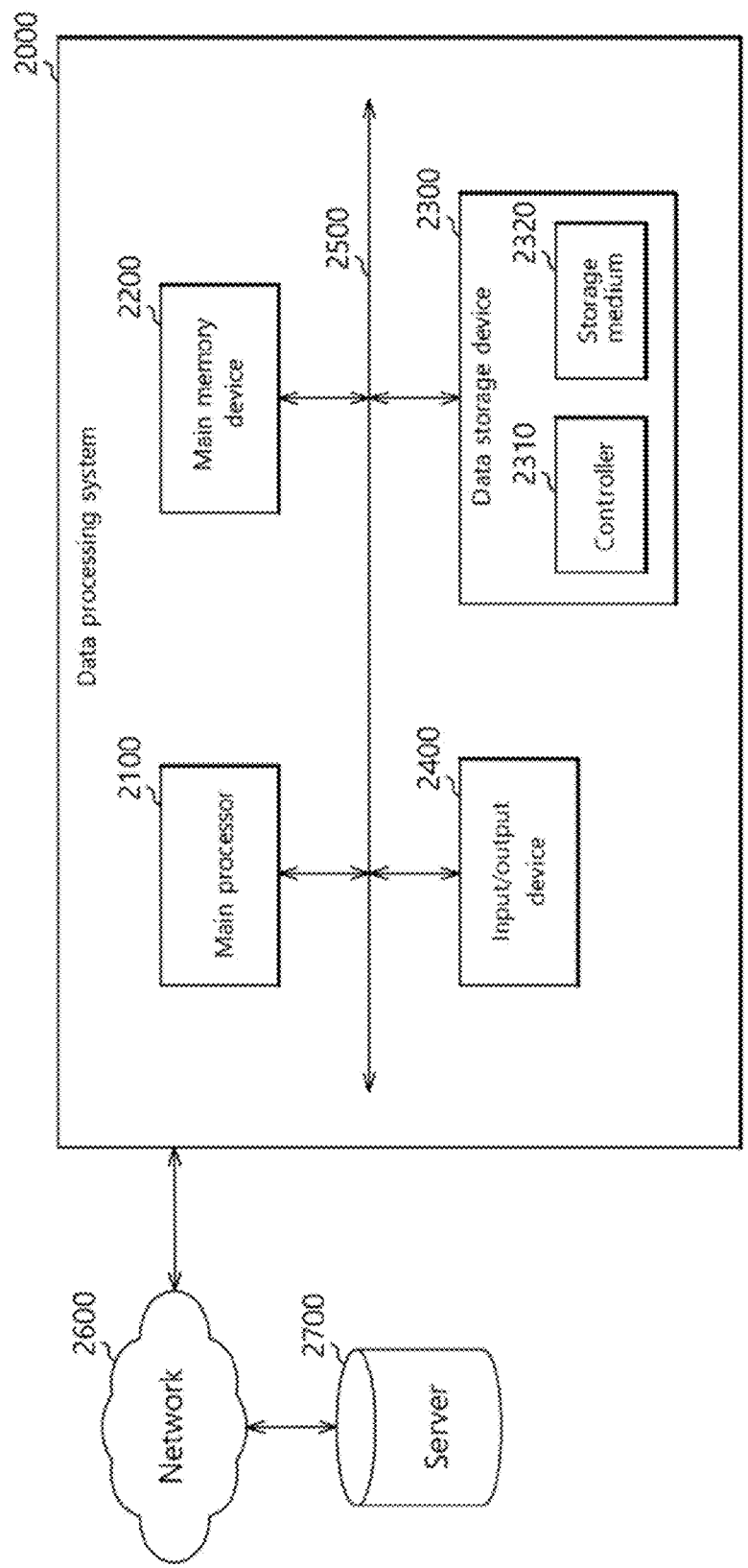
FIG. 18 is a block diagram illustrating a data processing system including a data storage device, according to an embodiment of the invention.

FIG. 18 is a block diagram illustrating a data processing system 2000 to which the data storage device 10 is applied as a data storage device 2300, according to an embodiment of the invention.

The data processing system 2000 may include a computer, a laptop, a netbook, a smart phone, a digital TV, a digital camera, a navigator, and the like. The data processing system 2000 may include a main processor 2100, a main memory device 2200, a data storage device 2300, and an input/output device 2400. The internal units of the data processing system 2000 may exchange data, control signals, and the like through a system bus 2500.

The main processor 2100 may control the operations of the data processing system 2000. For example, the main processor 2100 may be a central processing unit, such as a microprocessor. The main processor 2100 may execute the software of an operation system, an application, a device driver, and so forth, on the main memory device 2200.

The main memory device 2200 may store programs and program data to be used by the main processor 2100. The main memory device 2200 may temporarily store data to be transmitted to the data storage device 2300 and the input/output device 2400.

The data storage device 2300 may include a controller 2310 and a storage medium 2320. The data storage device 2300 may be configured and operate in a manner substantially similar to the data storage device 10 shown in FIG. 1.

The input/output device 2400 may be or include a keyboard, a scanner, a touch screen, a screen monitor, a printer, a mouse, or the like, capable of exchanging data with a user, such as receiving a command for controlling the data processing system 2000 from the user or providing a processed result to the user.

According to an embodiment, the data processing system 2000 may communicate with at least one server 2700 through a network 2600 such as a local area network (LAN), a wide area network (WAN), a wireless network, and so on. The data processing system 2000 may include a network interface (not shown) to access the network 2600.

While various embodiments have been described above, it will be understood to those skilled in the art that the embodiments described are examples only. Accordingly, the data storage device and the operating method thereof described herein should not be limited based on the described embodiments. Many other embodiments and or variations thereof may be envisaged by those skilled in the relevant art without departing from the spirit and or scope of the present invention as defined in the following claims.

What is claimed is:

1. A method for operating a data storage device including a nonvolatile memory device suitable for accessing a plurality of memory regions through a plurality of word lines, each word line corresponding to different types of memory regions, comprising:
receiving data in a data buffer;
generating parity data for the data, the parity data corresponding to types of memory regions in which the data is to be stored;
determining whether a predetermined trigger has occurred, wherein the predetermined trigger is a command from an external device or an entry to a predetermined operation mode;
performing a first write operation which stores the data from the data buffer into one or more empty memory regions for one or more target word lines, when the predetermined trigger has not occurred and a size of the data corresponds with a size of a write unit;
comparing the size of the data with a size of the empty memory regions;
comparing the size of the data and a size of selected parity data with the size of the empty memory regions, by selecting the selected Parity data among the parity data such that the selected parity data corresponds to a type of an empty memory region in which the selected parity data is to be stored; and
performing a second write operation when the predetermined trigger has occurred, which stores the data from the data buffer into the empty memory regions when the size of the data corresponds to the size of the empty memory regions, or
stores the data from the data buffer and the selected parity data into the empty memory regions when the size of the data and the selected parity data corresponds to the size of the empty memory regions, or
stores the data from the data buffer, the selected parity data, and dummy data into the empty memory regions when the size of the data and the selected rarity data is smaller than the size of the empty memory regions.

2. The method according to claim 1, further comprising determining whether an unstable word line exists in the target word lines, storing second selected parity data in an empty memory region for the unstable word line when the unstable word line exists, no data remains in the data buffer, and the size of the second selected parity data corresponds to a size of the empty memory region, or storing the second selected parity data and the dummy data in the empty memory region when the unstable word line exists, no data remains in the data buffer, and the size of the second selected parity data does not correspond to the size of the empty memory region,
wherein the second selected parity data is selected among the parity data such that the second selected parity data corresponds to a type of the empty memory region.

3. The method according to claim 2, wherein the unstable word line occurs when memory regions for a target word line have partially stored data at a time when the predetermined trigger occurred.

4. A data storage device comprising:
a nonvolatile memory device suitable for accessing a plurality of memory regions through a plurality of word lines, each word line corresponding to different types of memory regions; and
a controller suitable for receiving data to be stored in the nonvolatile memory device from an external device, temporarily storing the data in a buffer before storing the data in the nonvolatile memory device, generating parity data for the data, the parity data corresponding to types of memory regions in which the data is to be stored, comparing a size of the data with a size of one or more empty memory regions for one or more target word lines, and comparing a size of the data and selected parity data with the size of the empty memory regions, by selecting the selected parity data among the parity data such that the selected parity data corresponds to a type of an empty memory region in which the selected parity data is to be stored, and detecting whether a trigger has occurred, the trigger being a command from an external device or an entry to a predetermined operation mode,
wherein, when the trigger is not detected and the size of the data corresponds to a size of a write unit, the controller stores the data from the buffer in the empty memory regions,
wherein, when the trigger is detected and the size of the data corresponds to the size of the empty memory regions, the controller stores the data from the buffer in the empty memory regions,
wherein, when the trigger is detected and the size of the data and the selected parity data corresponds to the size of the empty memory regions, the controller stores the data from the buffer and the selected parity data in the empty memory regions, and
wherein, when the trigger is detected and the size of the data and the selected parity data is smaller than the size of the empty memory regions, the controller stores the data from the buffer, the selected parity data, and dummy data in the empty memory regions.

5. The data storage device according to claim 4, further comprising the controller determining whether an unstable word line exists in the target word lines;
storing second selected parity data in an empty memory region for the unstable word line when no data remains in the data buffer, the unstable word line exists, and the size of the second selected parity data corresponds to a size of the empty memory region, or
storing the second selected parity data and the dummy data when no data remains in the data buffer, the unstable word line exists, and the size of the second selected parity data does not correspond to the size of the empty memory region,
wherein the second selected parity data is selected among the parity data such that the second selected parity data corresponds to a type of the empty memory region.

6. The data storage device according to claim 5, wherein the unstable word line occurs when empty memory regions for a target word line have partially stored data at a time when the trigger is detected.

* * * * *